(12) United States Patent
Koe

(10) Patent No.: US 10,054,974 B1
(45) Date of Patent: Aug. 21, 2018

(54) CURRENT MIRROR DEVICES USING CASCODE WITH BACK-GATE BIAS

(71) Applicant: GLOBALFOUNDRIES Inc., Grand Cayman (KY)

(72) Inventor: Wern Koe, Irving, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/480,931

(22) Filed: Apr. 6, 2017

(51) Int. Cl.
 *G05F 3/26* (2006.01)
 *H01L 27/12* (2006.01)
 *H01L 29/10* (2006.01)

(52) U.S. Cl.
 CPC .......... *G05F 3/262* (2013.01); *H01L 27/1203* (2013.01); *H01L 29/1095* (2013.01)

(58) Field of Classification Search
 CPC .................................. G05F 3/26; G05F 3/262
 See application file for complete search history.

(56) References Cited

U.S. PATENT DOCUMENTS

| | | | | |
|---|---|---|---|---|
| 6,177,788 B1* | 1/2001 | Narendra | ................ | G05F 3/262 323/315 |
| 6,211,659 B1* | 4/2001 | Singh | ...................... | G05F 3/262 323/315 |
| 6,888,401 B1* | 5/2005 | Tanase | .................... | G05F 3/262 327/538 |
| 9,490,007 B1* | 11/2016 | Chan | ...................... | G11C 11/419 |
| 9,799,393 B1* | 10/2017 | Ramamurthy | ........ | G11C 11/412 |
| 2004/0080340 A1* | 4/2004 | Hidaka | ................... | G11C 5/147 326/83 |
| 2004/0124904 A1* | 7/2004 | Wu | ......................... | G05F 3/262 327/427 |
| 2007/0200545 A1* | 8/2007 | Loi | ......................... | G05F 3/262 323/315 |
| 2008/0072181 A1* | 3/2008 | Baumgartner | .......... | G05F 3/205 327/53 |
| 2008/0258778 A1* | 10/2008 | Schreiter | ................. | G05F 3/262 327/108 |
| 2010/0019806 A1 | 1/2010 | Bien | | |
| 2010/0148870 A1* | 6/2010 | Zolnhofer | ............... | G05F 3/262 330/257 |
| 2014/0247087 A1* | 9/2014 | Bhattad | ..................... | G05F 1/56 327/541 |
| 2016/0065201 A1* | 3/2016 | Ishizawa | .............. | H03K 17/161 327/382 |
| 2016/0079277 A1 | 3/2016 | Hook et al. | | |

* cited by examiner

*Primary Examiner* — Timothy J Dole
*Assistant Examiner* — Sisay G Tiku
(74) *Attorney, Agent, or Firm* — Thompson Hine LLP; David Cain

(57) ABSTRACT

Current mirror devices and methods for operating a current mirror device. The current mirror device includes a first transistor having a gate, a source, a drain, and a back gate. The drain and the gate of the first transistor are coupled to an input node of the current mirror device. The current mirror device further includes a second transistor having a gate, a source, a drain, and a back gate. The drain of the second transistor is coupled to an output node of the current mirror device, and the gate of the second transistor is coupled to the gate of the first transistor and to the input node. A voltage source supplies a bias voltage to the back gate of the first transistor that adjusts a threshold voltage of the first transistor and to the back gate of the second transistor that adjusts a threshold voltage of the second transistor.

18 Claims, 1 Drawing Sheet

CURRENT MIRROR DEVICES USING CASCODE WITH BACK-GATE BIAS

BACKGROUND

The invention relates generally to electronic circuits and, in particular, to current mirror devices and methods for operating a current mirror device.

Current mirrors are widely used in analog integrated circuits. A current mirror is a transistor-based circuit that copies or "mirrors" a reference current in one active device by controlling a current in another active device. A current mirror may function as either a current source or a current sink. Current mirrors are often used to provide bias currents or to serve as an active load.

A basic diode configuration for a current mirror has an optimized input headroom and output headroom, but at the sacrifice of output resistance. A stacked configuration may result in an improved output resistance in comparison with the basic diode configuration and similar to increasing the transistor channel length in the basic diode configuration, but at the sacrifice of input headroom and output headroom. A cascode configuration for a current mirror has an output resistance that is appreciably higher than the output resistance of the basic diode configuration or the stacked configuration, but at the sacrifice of input headroom and output headroom. A swing-enhanced cascode configuration has an improved output resistance, input headroom, and output headroom in comparison with the cascode configuration, but requires an additional branch of biasing current. A self-biased swing-enhanced cascode configuration eliminates the additional branch of biasing current needed in the swing-enhanced cascode configuration, but at the sacrifice of input headroom due to the introduction of a resistor at the input node.

Improved current mirror devices and methods for operating a current mirror device are needed.

SUMMARY

In an embodiment of the invention, a current mirror device includes a first transistor having a gate electrode, a source, a drain, and a back gate. The drain and the gate electrode of the first transistor are coupled to an input node of the current mirror device. The current mirror device further includes a second transistor having a gate electrode, a source, a drain, and a back gate. The drain of the second transistor is coupled to an output node of the current mirror device, and the gate electrode of the second transistor is coupled to the gate electrode of the first transistor and to the input node. The current mirror device further includes a third transistor having a drain coupled to the source of the first transistor and a source coupled to a reference node, and a fourth transistor having a drain coupled to the source of the second transistor and a source coupled to the reference node. A voltage source is coupled to the back gate of the first transistor and to the back gate of the second transistor. The voltage source is configured to supply a bias voltage to the back gate of the first transistor that adjusts a threshold voltage of the first transistor and to the back gate of the second transistor that adjusts a threshold voltage of the second transistor.

In an embodiment of the invention, a method is provided for operating a current mirror device that includes an input stage with a first transistor and a second transistor arranged with a stacked configuration with the first transistor, and an output stage with a first transistor and a second transistor arranged with a stacked configuration with the first transistor. The method includes applying a bias voltage to a back gate of the first transistor in the input stage and a back gate of the first transistor in the output stage. The bias voltage alters the threshold voltage of the first transistor in the input stage and the threshold voltage of the first transistor in the output stage such that the first transistor and the second transistor of the input stage are operating in saturation mode and the first transistor and the second transistor of the output stage are operating in saturation mode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
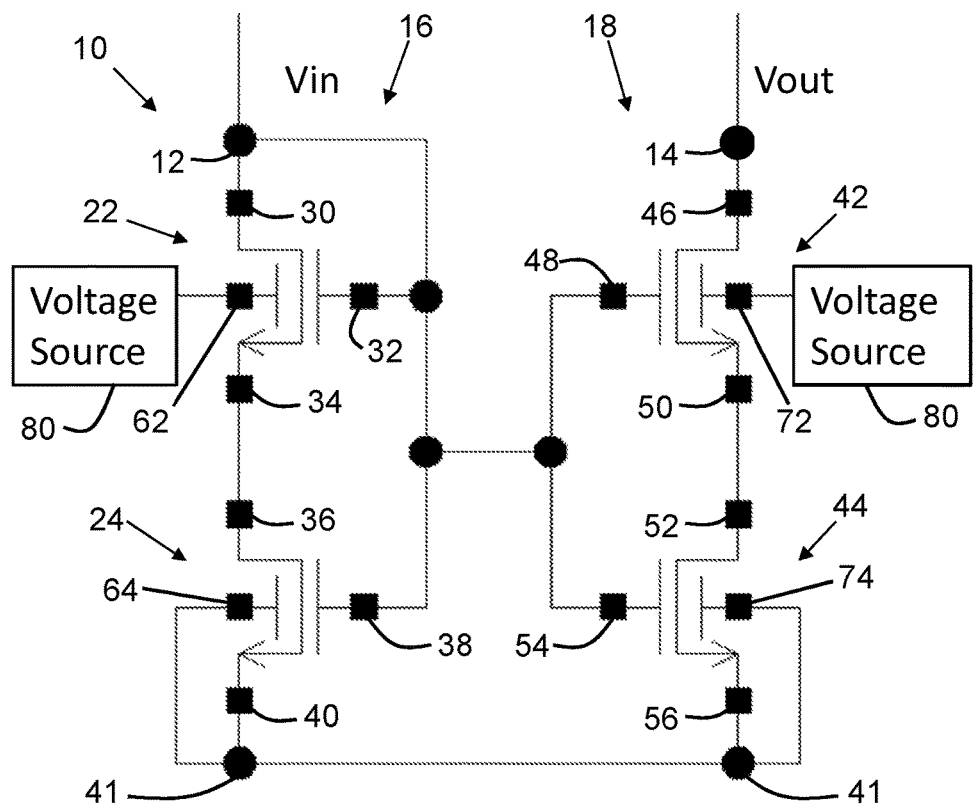
FIG. 1 is a schematic view of an electrical circuit for a current mirror in accordance with embodiments of the invention.

With reference to FIG. 1 and in accordance with embodiments of the invention, a current mirror circuit or device 10 may include an input node 12, an output node 14, an input stage 16, and an output stage 18. The input node 12 may be coupled to a current source and may be configured to receive an input current from the current source at a given input voltage, Vin. The output node 14 may be configured to source an output current at a given output voltage, Vout, for a load that is connected with the current mirror device 10.

The input stage 16 includes a field-effect transistor 22 and a field-effect transistor 24 that are arranged with a stacked configuration in a cascode circuit. In a stacked configuration, the drain of one field-effect transistor is coupled by wiring in an electrical path to the source of another field-effect transistor such that a current passes through the coupled field-effect transistors (e.g., between drain and source) in series. The field-effect transistor 22 includes a drain 30 coupled by wiring in an electrical path to the input node 12, a gate electrode 32, and a source 34. The field-effect transistor 24 includes a drain 36 that is coupled by wiring in an electrical path to the source 34 of field-effect transistor 22, a gate electrode 38 that is coupled by wiring in an electrical path to the input node 12 so as to be connected with the input voltage, and a source 40 that is coupled by wiring in an electrical path to a reference node 41 to receive or establish a reference potential. In an embodiment, when the field-effect transistors 22, 24 are n-type field-effect transistors, the reference node 41 may correspond to an electrical ground (i.e., zero (0) volts). The input voltage, Vin, at the input node 12 corresponds to the voltage drop across the input stage 16 of the current mirror device 10.

The output stage 18 includes a field-effect transistor 42 and a field-effect transistor 44 that are arranged with a stacked configuration in a cascode circuit. Field-effect transistors 42, 44 are of the same field-effect transistor type (e.g., n-type field-effect transistors) and/or present in the same number as the field-effect transistors 22, 24 in the input node 12. The field-effect transistor 42 includes a drain 46 that is coupled by wiring in an electrical path to the output node 14, a gate electrode 48, and a source 50. The field-effect transistor 44 includes a drain 52 that is coupled by wiring in an electrical path to the source 50 of field-effect transistor 42, a gate electrode 54, and a source 56 that is coupled by wiring in an electrical path to the reference node 41. The output voltage, Vout, at the output node 14 corresponds to the voltage drop across the output stage 18 of the current mirror device 10.

The gate electrode 48 of the field-effect transistor 42 is coupled by wiring in an electrical path to the gate electrode 32 of the field-effect transistor 22 such that the field-effect transistor 22 and the field-effect transistor 42 constitute a field-effect transistor pair. The gate electrode 54 of the field-effect transistor 44 is coupled by wiring in an electrical path to the gate electrode 38 of the field-effect transistor 24 (e.g., input node 12) such that the field-effect transistor 24 and the field-effect transistor 44 constitute a field-effect transistor pair. All of the gate electrodes 32, 38, 48, and 54 are coupled by wiring in an electrical path to the input node 12.

The field-effect transistor 22 includes a back gate 62 that is available to be electrically biased in order to adjust the threshold voltage of the field-effect transistor 22. The field-effect transistor 42 includes a back gate 72 that is available to be electrically biased in order to adjust the threshold voltage of the field-effect transistor 42. The threshold voltage represents the applied gate voltage needed at gate electrodes 32 and 48 to create an inversion charge in which the density is equal to the concentration of majority carriers in the device layer 102 (FIG. 2), which places the field-effect transistors 22, 42 in an "ON" state.

Current applied to the input node 12 and at the back gate 62 of the field-effect transistor 22 can be used to control of the behavior of the field-effect transistor 22 and to set up the input voltage at the input node 12. The voltage setup at input node 12, which is coupled to the gate electrode 48 and back gate 72 of the field-effect transistor 42, can be used to control the behavior of the field-effect transistor 42 and the output current at the output node 14. The bias voltages (i.e., the back-gate bias voltages) supplied to the back gates 62, 72 are non-zero (i.e., the back gates 62, 72 are not grounded).

The voltage supplied to the back gate 62 of field-effect transistor 22 may be equal to voltage supplied to the back gate 72 of field-effect transistor 42. In an embodiment, the back gate 62 of field-effect transistor 22 and the back gate 72 of field-effect transistor 42 may be coupled in parallel with a direct current (DC) biasing potential from a voltage source 80. In an embodiment, the voltage source 80 may be a positive ($V_{DD}$) power rail of a power supply for the chip on which the current mirror device 10 is located, which may be the same power supply that is providing the reference node 41 to the current mirror device 10. In an embodiment, the voltage source 80 may be independent of the positive ($V_{DD}$) power rail of the power supply, and instead may be another available voltage supply capable of supplying a bias voltage different than the voltage of the positive power rail. The bias voltage supplied by the available power supply may be fixed at a predetermined value. Alternatively, the voltage source 80 may be a programmable power supply in which the bias voltage may be programmable so as to permit the supply of a given fixed value of bias voltage with remote control of the operation of the power supply through an analog input or digital interface.

In an embodiment, the field-effect transistor 24 may include a back gate 64 and the field-effect transistor 44 may include a back gate 74 that are each tied to the reference node 41. As a result, the field-effect transistors 24, 44 may have different threshold voltages than the field-effect transistors 22, 42 through the application of different back gate voltages.

The field-effect transistors 22 and 42 may have the same gate width (W) and gate length (L) such that they are same-sized (W/L) in order to have the same threshold voltage (Vth) in the absence of the bias potential applied at the back gate 62 of field-effect transistor 22 and the back gate 72 of field-effect transistor 42. In addition, the same back-gate bias may be applied to the field-effect transistors 22 and 42 such that, when biased, their threshold voltages are equal. Similarly, the field-effect transistors 24 and 44 may also be same-sized. The field-effect transistors 22, 42 may be matched to have equal sizes for a 1:1 current mirror ratio and the field-effect transistors 24, 44 may also be matched to have equal sizes. The field-effect transistors 22, 42 can be scaled to provide unequal sizes to provide a current mirror ratio that is different from 1:1. For example, in a 1:2 current mirror, the field-effect transistors 42, 44 of the output stage 18 are scaled in size by a factor of two (2) relative to the field-effect transistors 22, 24 of the input stage 16, and the input stage 16 may include two units of identically sized (W/L) field-effect transistors 22, 24.

The back gate bias may be used to increase the output resistance of the current mirror device 10 if the back gate 62 of field-effect transistor 22 and the back gate 72 of field-effect transistor 42 are biased such that all of the field-effect transistors 22, 24, 42, 44 are operating in a saturation mode of operation, which increases the output resistance in a manner similar to a swing-enhanced cascode current mirror or a self-biased swing-enhanced cascode current mirror. In a conventional stacked configuration for a current mirror, at least the field-effect transistors 24 and 44 are operating in a triode mode of operation. The saturation mode of operation is a bias mode for operation of the field-effect transistors 22, 24, 42, 44 in which the drain-to-source voltage (VDS) is greater than or equal to the saturation voltage (VDSAT). The threshold voltage (VT) is a physical parameter that at least in part determines the saturation voltage, and represents a minimum difference in the gate-to-source voltage needed for channel formation in the transistor body.

In an embodiment, the threshold voltage of field-effect transistor 24 may be greater than a sum of the saturation voltage of field-effect transistor 22 and the threshold voltage of field-effect transistor 22 when adjusted with the back-gate bias, and the threshold voltage of field-effect transistor 22 is greater than zero (i.e., positive). The same relationships apply for the field-effect transistors 42 and 44 in that the threshold voltage of field-effect transistor 44 may be greater than the sum of the saturation voltage of field-effect transistor 42 and the threshold voltage of field-effect transistor 42 when adjusted with the back-gate bias, and the threshold voltage of field-effect transistor 42 is greater than zero (i.e., positive). The size (W/L) of the field-effect transistors 22, 42 may be selected to at least in part satisfy the conditions of these operating point requirements.

The current mirror device 10, when operating under these operating point requirements, may have a headroom characteristic of a swing-enhanced cascode configuration but without the need of additional bias current from an additional branch that increases the chip area consumed and also increases power consumption. The current mirror device 10 may be characterized by an increased output resistance in comparison to similar current mirror devices that lack back gate biasing, and accomplishes the increased output resistance without sacrificing input headroom at the input node 12 and output headroom at the output node 14, and while maintaining a low size and/or area for the field-effect transistors 22, 24, 42, 44.

In an embodiment, the operating point requirement can be relaxed if the field-effect transistors 22, 42 have different threshold voltages than the field-effect transistors 24, 44. For example, the field-effect transistors 22, 42 may be configured to have a threshold voltage that is less than the threshold voltage of field-effect transistors 24, 44. As an example, the field-effect transistors 24, 44 may be low-threshold voltage field-effect transistors (LVT for Low Vt) and the field-effect transistors 22, 42 may be super low-threshold voltage field-effect transistors (SLVT for Super Low Vt). The threshold voltages of the field-effect transistors 22, 24, 42, 44 can be selected using, among other parameters, the work function metals for the gate electrodes 32, 38, 48, 54, the transistor type (i.e., n-type or p-type), and the conductivity type of the semiconductor material of the respective back gates 62, 64, 72, 74.

In an embodiment, the field-effect transistors 22, 24, 42, 44 may be n-type field-effect transistors such that the current mirror device 10 sinks current to the reference node 41. In an embodiment, the field-effect transistors 22, 24, 42, 44 may be p-channel field-effect transistors in which the current mirror device 10 sources current from the positive power supply, Vdd.

Figure 2:
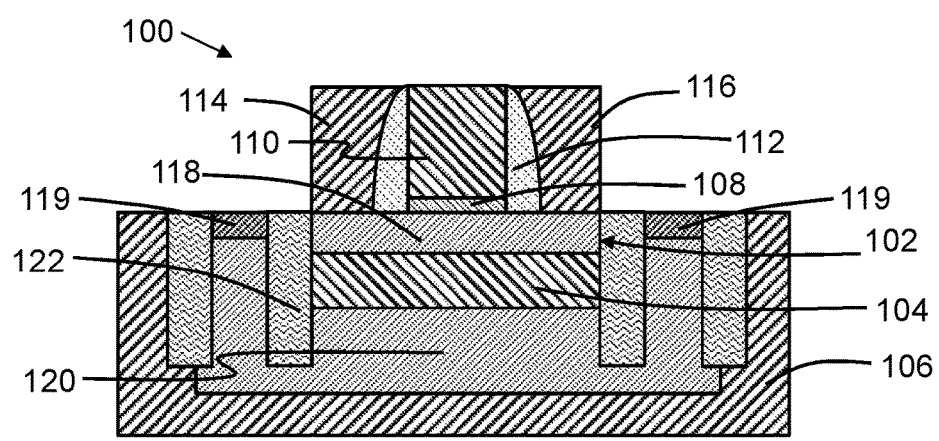
FIG. 2 is a cross-sectional view of a field-effect transistor that may be used in constructing the current mirror of FIG. 1.

With reference to FIG. 2 in which like reference numerals refer to like features in FIG. 1, a field-effect transistor 100 is shown that may be used as a device structure for the field-effect transistors 22, 24, 42, 44. The field-effect transistor 100 may be fabricated using a semiconductor-on-insulator (SOI) substrate by complementary metal oxide semiconductor (CMOS) processes during front-end-of-line (FEOL) processing. The SOI substrate includes a device layer 102, a buried dielectric layer in the form of a buried oxide (BOX) layer 104 comprised of an oxide of silicon (e.g., $SiO_2$), and a handle wafer 106. The device layer 102 is separated from the handle wafer 106 by the intervening BOX layer 104 and is considerably thinner than the handle wafer 106. The device layer 102 and the handle wafer 106 may be comprised of a single crystal semiconductor material, such as single crystal silicon. The device layer 102 is electrically isolated from the handle wafer 106 by the BOX layer 104. In an embodiment, the SOI substrate may be an extremely thin semiconductor-on-insulator (ETSOI) substrate and may be used to fabricate the field-effect transistors 22, 24, 42, 44 using CMOS FEOL processes as fully-depleted SOI devices (FDSOI).

The field-effect transistor 100 includes a gate dielectric 108 and a gate electrode 110 that is separated from the device layer 102 by the gate dielectric 108. The gate electrode 110 may be comprised of a conductor, such as doped polysilicon or one or more metals, and the gate dielectric 108 may be comprised of a dielectric or insulating material. Non-conductive spacers 112 may be provided at the vertical sidewalls of the gate electrode 110.

The field-effect transistor 100 includes raised source/drain regions 114, 116 that are arranged on opposite sides of the gate electrode 110 and are separated from the gate electrode 110 by the non-conductive spacers 112. As used herein, the term "source/drain region" means a doped region of semiconductor material that can function as either a source or a drain of the field-effect transistor 100. The semiconductor material of the source/drain regions 114, 116 may comprise an n-type dopant from Group V of the Periodic Table (e.g., phosphorus (P) or arsenic (As)) that is effective to impart n-type conductivity. Alternatively, the semiconductor material of the source/drain regions 114, 116 may comprise a p-type dopant selected from Group III of the Periodic Table (e.g., boron (B)) that is effective to impart p-type conductivity.

A portion of the device layer 102 between the source/drain regions 114, 116 and vertically beneath the gate electrode 110 constitutes a transistor body 118 through which a gated current is switched through a channel. Shallow trench isolation 122 is formed that, in conjunction with the BOX layer 104, delimits the transistor body 118. The field-effect transistor 100 further includes a back gate 120 in the handle wafer 106 that is aligned with the gate electrode 110 and separated from the transistor body 118 by the BOX layer 104. The transistor body 118 is arranged vertically between the back gate 120 and the gate electrode 110. Highly-doped contacts 119 provide a connection with the back gate 120. The semiconductor material of the back gate 120 may be doped to have the same conductivity type (i.e., polarity) as the semiconductor material of the source/drain regions 114, 116 or, alternatively, the semiconductor material of the back gate 120 may be doped to have the opposite conductivity type (i.e., polarity) from the semiconductor material of the source/drain regions 114, 116. Among other parameters, the threshold voltage of the field-effect transistor 100 can be adjusted by applying a bias potential to the back gate 120.

The gate electrode 110, when biased with a given voltage exceeding the threshold voltage, applies an electric field to the transistor body 118 to switch the field-effect transistor 100 between an "ON" state in which its channel becomes conductive and an "OFF" state. In the "ON" state, charge carriers flow in the channel through the transistor body 118 from the one of the source/drain regions 114, 116 serving as a source for field-effect transistor 100 to the other of the source/drain regions 114, 116 serving as the drain of the field-effect transistor 100. In the "OFF" state, the transistor body 118 of the field-effect transistor 100 may be considered to be fully depleted because there are substantially no free charge carriers over the entire height of the transistor body 118. In embodiments in which the field-effect transistor 100 has a FDSOI device structure, this depletion layer extends vertically in the transistor body 118 over the entire thickness of the device layer 102.

In an embodiment, the field-effect transistors 22, 42 may be super low-threshold voltage field-effect transistors implemented as n-type field-effect transistors with an n-type back gate 120, and the field-effect transistors 24, 44 may be low-threshold voltage field-effect transistors implemented as n-type field-effect transistors with a p-type back gate 120.

The methods as described above may be used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A current mirror device having an input node and an output node, the current mirror device comprising:
    a first transistor having a gate electrode, a source, a drain, and a back gate, the drain and the gate electrode of the first transistor coupled to the input node;
    a second transistor having a gate electrode, a source, and a drain coupled to the output node, the gate electrode of the second transistor coupled to the gate electrode of the first transistor and coupled to the input node;
    a third transistor having a drain coupled to the source of the first transistor and a source coupled to a reference node;
    a fourth transistor having a drain coupled to the source of the second transistor and a source coupled to the reference node; and
    a voltage source coupled to the back gate of the first transistor,
    wherein the voltage source is configured to supply a bias voltage to the back gate of the first transistor that adjusts a threshold voltage of the first transistor, the first transistor has a saturation voltage, the third transistor has a threshold voltage that is greater than a sum of the saturation voltage of the first transistor and the threshold voltage of the first transistor, and the threshold voltage of the first transistor is greater than zero.

2. The current mirror device of claim 1 wherein the first transistor and the second transistor are fully-depleted silicon-on-insulator device structures fabricated using complementary metal-oxide-semiconductor processes.

3. The current mirror device of claim 1 wherein the first transistor and the second transistor are n-type field-effect transistors.

4. The current mirror device of claim 1 further comprising:
    a substrate including a device layer, a buried oxide layer, and a handle wafer,
    wherein the back gate of the first transistor is located in the handle wafer, the first transistor includes a body between the source and the drain, and the body of the first transistor is arranged vertically between the gate electrode of the body of the first transistor and the back gate of the first transistor.

5. The current mirror device of claim 4 wherein the second transistor includes a back gate that is located in the handle wafer, and the second transistor includes a body arranged vertically between the gate electrode of the second transistor and the back gate of the second transistor.

6. The current mirror device of claim 1 wherein the third transistor has a gate electrode, the fourth transistor has a gate electrode, and the gate electrode of the third transistor and the gate electrode of the fourth transistor are coupled to the gate electrode of the first transistor and the gate electrode of the second transistor.

7. The current mirror device of claim 1 wherein the third transistor has a back gate, and the fourth transistor has a back gate, and the back gate of the third transistor and the back gate of the fourth transistor are coupled to the reference node.

8. The current mirror device of claim 1 wherein the second transistor has a threshold voltage equal to the threshold voltage of the first transistor, the fourth transistor has a threshold voltage equal to the threshold voltage of the third transistor, and the threshold voltage of the second transistor is less than the threshold voltage of the fourth transistor.

9. The current mirror device of claim 1 wherein the first transistor includes a gate width and a gate length that are selected at least in part to provide the threshold voltage of the first transistor, and the second transistor includes a gate width and a gate length that are selected at least in part to provide the threshold voltage of the second transistor.

10. The current mirror device of claim 1 wherein the voltage source is a positive power rail of a power supply for a chip on which the current mirror device is located.

11. The current mirror device of claim 1 wherein the reference node is coupled to electrical ground.

12. The current mirror device of claim 1 wherein the voltage source is a power supply independent of a positive power rail for a chip on which the current mirror device is located, and the bias voltage is different in value from a positive supply voltage supplied by the positive power rail.

13. The current mirror device of claim 1 wherein the voltage source is a power supply configured to supply a fixed value of the bias voltage.

14. The current mirror device of claim 1 wherein the voltage source is a programmable power supply configured to be programmed to supply a given value of the bias voltage.

15. The current mirror device of claim 1 wherein the second transistor has a saturation voltage, the fourth transistor has a threshold voltage that is greater than a sum of the saturation voltage of the second transistor and the threshold voltage of the second transistor, and the threshold voltage of the second transistor is greater than zero.

16. The current mirror device of claim 1 wherein the second transistor includes a back gate, the voltage source is coupled to the back gate of the second transistor, and the voltage source is configured to supply the bias voltage to the back gate of the second transistor that adjusts a threshold voltage of the second transistor.

17. A method of operating a current mirror device, the current mirror device including an input stage with a first transistor and a second transistor arranged with a stacked configuration with the first transistor, and the current mirror device including an output stage with a first transistor and a second transistor arranged with a stacked configuration with the first transistor, the method comprising:
    applying a bias voltage to a back gate of the first transistor in the input stage and a back gate of the first transistor in the output stage,
    wherein the bias voltage alters a threshold voltage of the first transistor in the input stage and a threshold voltage of the first transistor in the output stage such that the first transistor and the second transistor of the input stage are operating in saturation mode and the first transistor and the second transistor of the output stage are operating in saturation mode, the first transistor in the input stage has a saturation voltage, the second transistor in the input stage has a threshold voltage that is greater than a sum of the saturation voltage of the first transistor in the input stage and the threshold voltage of the first transistor in the input stage, and the threshold voltage of the first transistor in the input stage is greater than zero.

18. The method of claim 17 wherein the first transistor in the output stage has a saturation voltage, the second transistor in the output stage has a threshold voltage that is greater than a sum of a saturation voltage of the first transistor in the output stage and the threshold voltage of the first transistor in the output stage, and the threshold voltage of the first transistor in the output stage is greater than zero.

\* \* \* \* \*